US012794493B2

(12) United States Patent
Xie et al.

(10) Patent No.: US 12,794,493 B2
(45) Date of Patent: Nov. 10, 2026

(54) MICRO-SMALL FORM FACTOR (USFF) STARING RECEIVER AS A PASSIVE SENSOR

(71) Applicant: Rockwell Collins, Inc., Cedar Rapids, IA (US)

(72) Inventors: Chenggang Xie, Phoenix, AZ (US); Orion D. Davies, Cedar Rapids, IA (US); Corey M. Sellner, Marion, IA (US); Ross K. Wilcoxon, Cedar Rapids, IA (US); Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 266 days.

(21) Appl. No.: 18/653,707

(22) Filed: May 2, 2024

(65) Prior Publication Data

US 2024/0396574 A1 Nov. 28, 2024

Related U.S. Application Data

(60) Provisional application No. 63/469,203, filed on May 26, 2023.

(51) Int. Cl.
*H04B 1/00* (2006.01)
*H05K 7/20* (2006.01)

(52) U.S. Cl.
CPC ......... *H04B 1/0053* (2013.01); *H05K 7/2039* (2013.01)

(58) Field of Classification Search
CPC .... H04B 1/06–30; H04B 1/38; H04B 1/0053; H05K 7/2039
See application file for complete search history.

(56) References Cited

U.S. PATENT DOCUMENTS

| | | | | |
|---|---|---|---|---|
| 7,265,993 | B1 * | 9/2007 | Slone | H05K 9/0066 361/760 |
| 10,469,295 | B2 | 11/2019 | Khoury et al. | |
| 10,516,426 | B1 | 12/2019 | Wyse | |
| 10,917,132 | B1 | 2/2021 | Wyse | |

(Continued)

OTHER PUBLICATIONS

Eric E. Johnson, "Staring Link Establishment for High-Frequency Radio", Milcom 2015 Track 1—Waveforms and Signal Processing.

(Continued)

*Primary Examiner* — Raymond S Dean
(74) *Attorney, Agent, or Firm* — Suiter Swantz IP

(57) ABSTRACT

A small-scale receiver design architecture is disclosed. The receiver architecture may include an amplifier, reconfigurable filters, a downconverter assembly, a processor, and one or more risers. The one or more risers may include ball grid array (BGA) interconnects configured for electrical coupling between the front-end assembly, the downconverter assembly, and the processor. The one or more risers may be configured to provide electromagnetically shielding to the front-end assembly, the downconverter assembly, and the processor. The one or more risers may be configured to thermally couple to the front-end assembly, the downconverter assembly, and the processor. The receiver architecture may include a sequential stacking of the one or more risers, the front-end assembly, the downconverter assembly, and the processor.

18 Claims, 2 Drawing Sheets

(56) References Cited

U.S. PATENT DOCUMENTS

| | | | | |
|---|---|---|---|---|
| 10,979,091 | B1 | 4/2021 | Wyse | |
| 11,146,304 | B2 | 10/2021 | Lee et al. | |
| 11,463,119 | B2 | 10/2022 | Eder et al. | |
| 2010/0182765 | A1* | 7/2010 | Vadas | H05K 9/0026 361/818 |
| 2016/0127003 | A1* | 5/2016 | Xu | H01Q 21/28 455/562.1 |
| 2016/0310044 | A1* | 10/2016 | Maeno | A61B 5/7221 |
| 2020/0393554 | A1* | 12/2020 | Safaripour | G01S 13/62 |
| 2021/0033698 | A1* | 2/2021 | Heinen | G01S 5/0289 |
| 2021/0218429 | A1* | 7/2021 | Stuenkel | H03H 11/04 |
| 2023/0059120 | A1* | 2/2023 | Ham | H01Q 13/02 |
| 2024/0203938 | A1* | 6/2024 | Hoo | H03H 9/0547 |

OTHER PUBLICATIONS

Ultra wideband sensor capability to be provided to U.S. Navy; Feb. 29, 2016https://www.baesystems.com/en-us/article/ultra-wideband-sensor-capability-to-be-provided-to-us-navy.

* cited by examiner

MICRO-SMALL FORM FACTOR (USFF) STARING RECEIVER AS A PASSIVE SENSOR

CROSS-REFERENCE TO RELATED APPLICATIONS

The present application claims the benefit under 35 U.S.C. § 119(e) of U.S. Provisional Application Ser. No. 63/469,203, filed May 26, 2023, entitled MICRO-SMALL FORM FACTOR (USFF) STARING RECEIVER AS A PASSIVE SENSOR, naming Chenggang Xie, Orion D. Davies, Corey M. Sellner, Ross K. Wilcoxon, and Russell D. Wyse, as inventors, which is incorporated herein by reference in the entirety.

TECHNICAL FIELD

The present disclosure relates generally to staring receiver systems and design architectures, and, more particularly, to receiver systems utilizing radio frequency (RF) integrated circuit topologies with thermal management and electromagnetic shielding in an ultra-small form factor.

BACKGROUND

Receiver systems play a crucial role in various communication applications, such as vehicle communications, cellular networks, satellite communication systems, wireless local area networks, and autonomous guidance systems, among others. Conventional receiver systems often face challenges in terms of size, thermal management, and electromagnetic interference, which can impact their performance and adaptability. Moreover, these systems may not be optimized for operating in multiple frequency bands or providing efficient space utilization, leading to limitations in their versatility and applicability in different communication scenarios. Furthermore, the integration of various components, such as amplifiers, downconverters, and processors, within the receiver systems can be complex.

Therefore, there is a need for a receiver system and design architecture that can address these issues.

SUMMARY

A receiver is disclosed in accordance with one or more illustrative embodiments of the present disclosure. In one illustrative embodiment, the receiver may include a RF front-end comprised of amplifiers and channelization filters and other signal conditioning components, down converting frequency mixers, a digitizer and processor, and one or more mechanical risers. In another illustrative embodiment, the one or more risers may include ball grid array (BGA) interconnects configured for electrical coupling between the front-end assembly, the downconverter assembly, the processor, and a host circuit board.

In another illustrative embodiment, the one or more risers may be configured to provide electromagnetically shielding to the front-end assembly, the downconverter assembly, and the processor. In another illustrative embodiment, the one or more risers may be configured to thermally couple to the front-end assembly, the downconverter assembly, and the processor. In another illustrative embodiment, the receiver may include a sequential stacking of the one or more risers, the front-end assembly, the downconverter assembly, and the processor. In another illustrative embodiment, the sequential stacking, in order, may include the front end, a first riser of the one or more risers, the downconverter assembly, a second riser of the one or more risers, and the processor.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Figure 1:
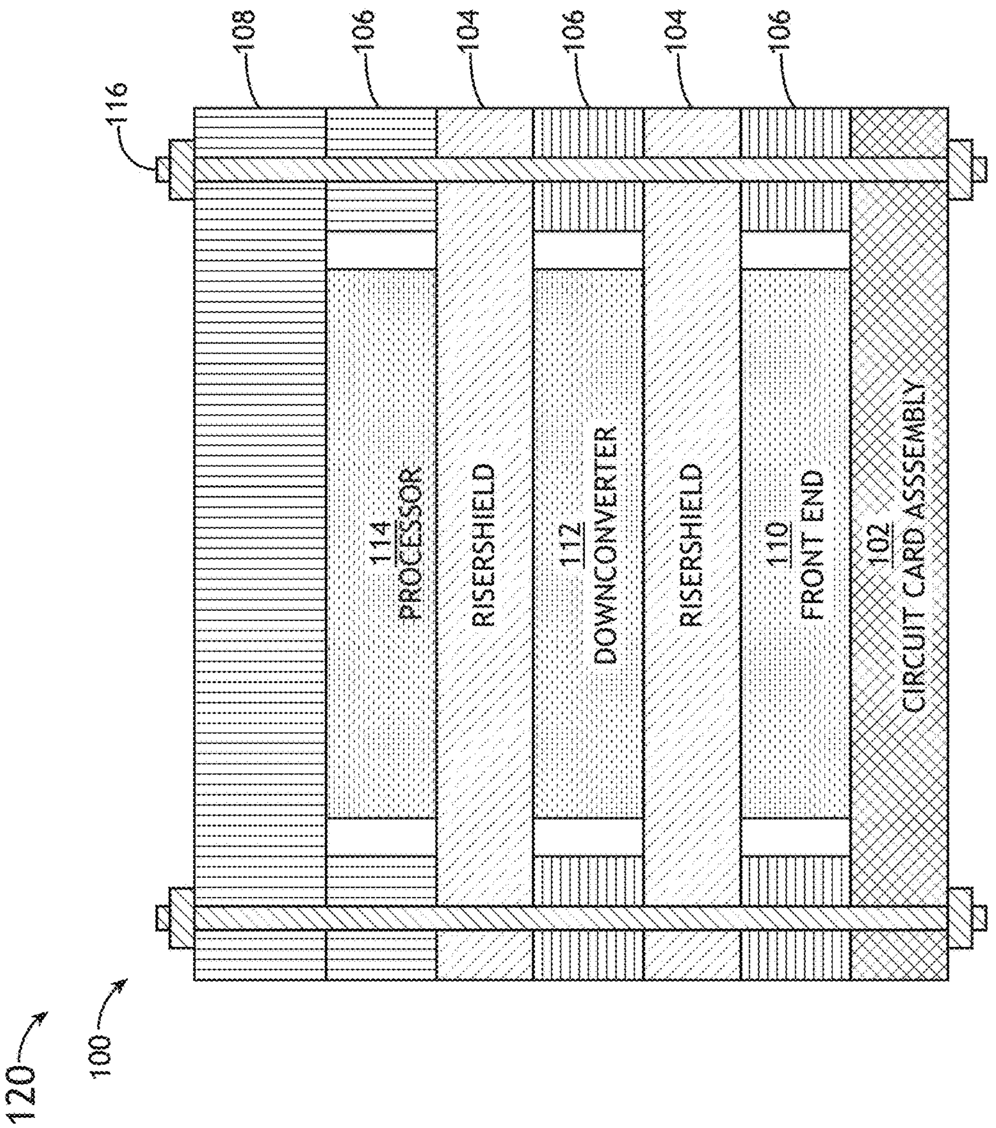
FIG. 1 is a block diagram illustrating a receiver that is sequentially stacked with risers, in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

The present disclosure provides a receiver system architecture with a sequentially stacked arrangement of components, including one or more risers, an RF front-end assembly, a downconverter assembly, and an RF System-on-Chip (RFSoC) processor. The risers provide electrical coupling, electromagnetic shielding, and thermal coupling between the components, while the heat sinks facilitate efficient heat dissipation. This configuration allows for improved performance, thermal management, and space utilization within the receiver in a small area compared to other methods of receivers (e.g., staring receivers or RF sensors).

By incorporating the features and configurations described herein in various embodiments, the receiver and design architecture can provide improved performance, thermal management, and electromagnetic shielding while maintaining a compact form factor and optimized space utilization.

The present disclosure may allow for a downconverter assembly comprising a set of reconfigurable downconverting mixers. For example, the receiver may include a wideband image suppressing receiver that can pass and downconvert frequencies (e.g., via the downconverter assembly) over a large overall range (e.g., from less than 1 GHz to greater than 55 GHz or more) in a small form factor. For example, state of the art methods may need more than 100 mm×100 mm and relatively more power to match the size and performance of embodiments herein which may include, but are not necessarily limited to, form factors less than 60 mm×60 mm footprint on circuit board. Embodiments herein may include multi-channel (e.g., 2 channel, 4 channel, 8 channel, and/or the like) downconverting differential receiver/mixers and/or amplifier topology designed to pass direct frequencies in a first frequency range and downconvert selectable sidebands in a second (e.g., higher) frequency range to an Analog-to-Digital Converter (ADC). The ADC may be configured to include a range of reconfigurable sideband rejection and an Instantaneous Bandwidth (IBW) per channel. Further, embodiments of receiver 100 may include a downconverted differential output Intermediate Frequency (IF) that is configured to be fed directly into an ADC differentially or single ended. The downconverter may be configured to (selectively) pass both sidebands, arbitrarily pass either sideband, and/or reject either sideband. The receiver (e.g., downconverter of the receiver) can also be digitally reconfigured to increase sideband rejection to higher levels at lower IBW. In general, the more channels implemented, the more spectrum can be sampled at once.

The receiver architecture may be configured to take an instantaneous snapshot of a portion of a spectrum (e.g., continuously monitor the entire portion of spectrum) using multiple channels per downconverter and direct sampling for lower frequency bands. For example, the continuous instantaneous snapshots may be used to monitor more than 5 GHz of spectrum, more than 8 GHZ, more than 55 GHZ, and/or the like. Further, the receiver may be configured to use the downconverters to monitor multiple (e.g., more than 10) sub bands to cover all frequencies in that range (e.g., more than 0.9 to 55 GHz at any moment in time). Each channel implementation in the architecture can be individually repurposed to a different operating center frequency with reconfigurable bandwidth.

The receiver architecture's ability to operate in multiple frequency bands and support various communication standards and signal types further enhances its adaptability and versatility in different communication scenarios. This innovative design offers a robust and reliable solution for a wide range of communication and RF sensing applications, including those in which conventional receivers may face limitations or challenges due to size, weight, power, and cost constraints.

FIG. 1 is a block diagram illustrating a system 120 with receiver 100 (e.g., which may be referred to as a "receiver architecture" 100) that is sequentially stacked with risers 104, in accordance with one or more embodiments of the present disclosure. The receiver 100 includes a front-end 110 (e.g., front end assembly), a downconverter 112 (e.g., downconverter assembly), and a processor 114 (e.g., RFSoC processor), which are electrically coupled using one or more risers 104.

The system 100 may include a circuit card assembly 102. For example, the receiver 100 may be coupled to a circuit card assembly 102 (i.e., circuit board). The receiver 100 may include the front-end assembly 110, the downconverter assembly 112, the processor 114, the one or more risers 104, the heat sink 106, and the top heat sink 108. The components may be secured together using any method such as adhesives and/or fasteners 116, ensuring a stable and robust assembly.

It should be understood that the embodiments described herein are not limited to the specific examples provided, but may be modified and adapted within the scope of the present disclosure. For example, the receiver 100 may include additional components, such as filters, mixers, oscillators, or other types of processors which may be integrated into the sequentially stacked arrangement. Furthermore, the receiver 100 may be implemented in various types of communication systems, such as cellular networks, satellite communication systems including ground based and orbital systems, wireless local area networks, airborne and ground based vehicle systems including autonomous unmanned vehicles, munitions guidance systems, or target recognition systems, among others.

In some embodiments, the front-end assembly 110 comprises a RF front-end assembly with amplifiers, filters, and other signal conditioning components, and is configured to receive a signal from an antenna (not shown). The front-end assembly 110 amplifies, filters, and otherwise conditions the received signal before it is passed to the downconverter assembly 112. The downconverter assembly 112 is configured to downconvert at least a portion of the amplified signal to lower frequency sub-bands for digitization and further processing. The processor 114 is configured to process the downconverted signals and perform various operations, which may include, but is not necessarily limited to, filtering, demodulation, signal identification, emitter identification, and digital data decoding, among others.

In certain embodiments, the processor 114 (e.g., which may be the same as processor 202 in FIG. 2) employed in the receiver 100 may be a Radio Frequency System-on-Chip (RFSoC) processor integrated into a System-in-Package (SiP). The integration of the RFSoC processor into a SiP allows for a compact and efficient design, providing improved performance and reduced power consumption. Furthermore, the use of an RFSoC processor enables the receiver 100 to support various communication standards and signal types, enhancing its adaptability and versatility in different communication scenarios.

The receiver 100 and hardware described herein can be interfaced with antenna systems integrated into small attritable platforms, such as drones, unmanned aerial vehicles (UAVs), or other compact communication devices. The receiver 100 can host signal classification and/or direction-finding algorithms in the Software Defined Radio (SDR) image on the attached or otherwise connected processor 114, enabling passive signal sensing, signal identification, emitter classification, and/or emission source location of obscured, occluded, or distant targets. This capability is particularly beneficial for applications where optical systems face challenges due to the direct line of sight required by cameras, such as in urban environments, mountainous terrains, or areas with dense foliage.

In order to address the challenges faced by conventional receivers and provide improved performance, thermal management, and electromagnetic shielding, the present disclosure may utilize active splitter/combiner functional cells. For example, the active splitter/combiner functional cells may include any embodiments disclosed in U.S. Pat. No. 10,516,426, titled "Systems and Methods for Wideband Image-Rejecting Receivers", filed on Sep. 26, 2018 and issued Dec. 24, 2019, which is herein incorporated by reference in its entirety. The cells may enable the receiver 100 to achieve enhanced functionality and performance in a compact integrated circuit (IC) area. The cells, when combined with quadrature Local Oscillator (LO) mixing and precision phase-shifting, may enable the receiver 100 to achieve much greater than 50 dBc of LO image rejection and eliminate high-frequency "flyback," which refers to unwanted out-of-band gain at higher frequencies than the passband. This innovative design approach allows for the realization of a compact and efficient receiver 100 that can effectively operate in multiple frequency bands and adapt to various communication standards and signal types.

The use of the cells in the receiver 100 not only contributes to a reduction in size and complexity of the system but also enhances the overall performance by providing better signal processing capabilities. For example, the active splitter/combiner functionality of the cells ensures that the signals are accurately processed and combined, resulting in a more reliable and efficient receiver 100. For example, the cells may include one or more elements of any of the figures of U.S. Pat. No. 10,516,426. However, note that the present disclosure does not necessarily use the reconfigurable filters of U.S. Pat. No. 10,516,426.

Furthermore, the incorporation of quadrature LO mixing with precision phase-shifting in the receiver 100 allows for improved signal processing and enhanced LO image rejection. This feature is particularly beneficial in communication systems where high levels of LO image rejection are required to minimize interference and ensure optimal signal quality at this small scale.

In embodiments, as shown, the downconverter assembly 112 and/or front-end assembly 110 may be embodied as a downconverter Multi-Chip-Module (MCM) and front-end MCM, respectfully. These modules may be stacked as shown.

In some embodiments, the antenna used in the receiver 100 may be a single and/or common antenna feed for each channel. This configuration allows for efficient space utilization and simplification of the overall system design. Moreover, the use of a single and/or common antenna feed can reduce the complexity of the antenna system, leading to reduced manufacturing costs and improved reliability. In some embodiments the individual receive channels may interface to multiple antennas with spatial separation for direction finding capability. In some embodiments, the common receive channel may interface to a phased array antenna system for directional applications. In some embodiments, individual channels may interface to separate antennas optimized for the specific frequency of the channel.

The one or more risers 104 are configured to be coupled between the front-end 110, the downconverter 112, and the processor 114. In some embodiments, the one or more risers 104 comprise ball grid array (BGA) interconnects configured for electrical coupling between the front-end 110, the downconverter 112, and the processor 114.

The one or more risers 104 may also be configured to provide electromagnetic shielding to the front-end 110, the downconverter 112, and the processor 114.

Additionally, the one or more risers 104 may be configured to thermally couple to the front-end 110, the downconverter 112, and the processor 114, facilitating heat dissipation and maintaining optimal operating temperatures for the components.

In some embodiments, the receiver 100 comprises a sequential stacking of the one or more risers 104, the front-end 110, the downconverter 112, and the processor 114. For example, the sequential stacking, in order, may comprise the front-end 110, a first riser 104 of the one or more risers 104, the downconverter 112, a second riser 104 of the one or more risers 104, and the processor 114. This arrangement allows for efficient use of space and improved thermal management within the receiver 100.

The receiver 100 may also comprise at least one heat sink 106, which can be configured to surround at least one of the front-end 110, the downconverter 112, or the processor 114 and to thermally couple to the one or more risers 104. In some embodiments, a top heat sink 108 may be provided to further enhance heat dissipation from the components of the receiver 100.

In certain embodiments, the receiver 100 is configured to operate in multiple frequency bands, allowing for increased versatility and adaptability to various communication standards and signal types.

Figure 2:
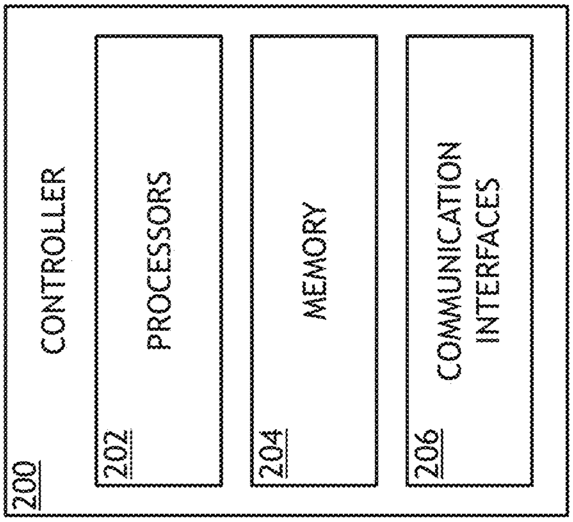
FIG. 2 is a block diagram illustrating a controller for the local oscillator image suppressing wideband reconfigurable receiver, in accordance with one or more embodiments of this disclosure.

FIG. 2 illustrates an embodiment of the controller 200, which may include, but is not limited to, at least one processor 202, memory 204, and communication interface 206. The processor 202 provides processing functionality for at least the controller 200 and can include any number of processors, micro-controllers, circuitry, field programmable gate array (FPGA) or other processing systems, and resident or external memory for storing data, executable code, and other information accessed or generated by the controller 200. The processor 202 can execute one or more software programs embodied in a non-transitory computer readable medium (e.g., memory 204) that implement techniques described herein. The processor 202 is not limited by the materials from which it is formed, or the processing mechanisms employed therein and, as such, can be implemented via semiconductor(s) and/or transistors (e.g., using electronic integrated circuit (IC) components), and so forth.

The memory 204 can be an example of tangible, computer-readable storage medium that provides storage functionality to store various data and/or program code associated with operation of the controller 200/processor 202, such as software programs and/or code segments, or other data to instruct the processor 202, and possibly other components of the controller 200, to perform the functionality described herein. Thus, the memory 204 can store data, such as a program of instructions for operating the controller 200, including its components (e.g., processor 202, communication interface 206, etc.), and so forth. It should be noted that while a single memory 204 is described, a wide variety of types and combinations of memory (e.g., tangible, non-transitory memory) can be employed. The memory 204 can be integral with the processor 202, can comprise stand-alone memory, or can be a combination of both. Some examples of the memory 204 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 206 can be operatively configured to communicate with components of the controller 200. For example, the communication interface 206 can be configured to retrieve data from the processor 202 or other devices, transmit data for storage in the memory 204, retrieve data from storage in the memory 204, and so forth. The communication interface 206 can also be communicatively coupled with the processor 202 to facilitate data transfer between components of the controller 200 and the processor 202. It should be noted that while the communication interface 206 is described as a component of the controller 200, one or more components of the communication interface 206 can be implemented as external components communicatively coupled to the controller 200 via a wired and/or wireless connection. The controller 200 may be connected to one or more input/output (I/O) devices, system components (e.g., front-end amplifier, multi-mode circuits, local oscillators (LO), phase-shifters, VGAs, band-end amplifiers, and/or tunable filters 128) and so forth via the communication interface 206. In embodiments, the communication interface 206 may include a transmitter, receiver, transceiver, physical connection interface, or any combination thereof.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "in embodiments", "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A system comprising a receiver architecture, the receiver architecture comprising:

a front-end assembly configured for amplification and filtering, the front-end assembly configured to receive a signal from an antenna;

a downconverter assembly configured to downconvert at least a portion of the signal;

a processor configured to process the signal; and one or more mechanical risers configured to be coupled between the front-end assembly, the downconverter assembly, and the processor, wherein the receiver architecture comprises a sequential physical stacking along a spatial direction of the one or more mechanical risers, the front-end assembly, the downconverter assembly, and the processor, wherein the spatial direction of the sequential physical stacking is configured to extend away from a footprint of the receiver architecture as defined relative to a circuit board.

2. The system of claim 1, wherein the one or more mechanical risers comprise ball grid array (BGA) interconnects configured for electrical coupling between the front-end assembly, the downconverter assembly, and the processor.

3. The system of claim 1, wherein the one or more mechanical risers are configured to provide electromagnetically shielding to the front-end assembly, the downconverter assembly, and the processor.

4. The system of claim 1, wherein the one or more mechanical risers are configured to thermally couple to the front-end assembly, the downconverter assembly, and the processor.

5. The system of claim 1, wherein the sequential physical stacking along the spatial direction, in order, comprises:

a front end, a first riser of the one or more mechanical risers, the downconverter assembly, a second riser of the one or more mechanical risers, and the processor.

6. The system of claim 1, wherein the receiver architecture comprises at least one heat sink.

7. The system of claim 6, wherein the at least one heat sink is configured to surround at least one of the front-end assembly, the downconverter assembly, or the processor and to thermally couple to the one or more mechanical risers.

8. The system of claim 1, wherein the receiver architecture is configured to operate in multiple frequency bands.

9. The system of claim 1, wherein the system comprises a circuit card assembly.

10. The system of claim 1, wherein the receiver architecture comprises a top heat sink coupled to the processor.

11. A staring receiver architecture, the staring receiver architecture comprising:

a front-end assembly comprising an amplifier, the front-end assembly configured to receive a signal from an antenna;

a downconverter assembly configured to downconvert at least a portion of the signal;

a processor configured to process the signal; and one or more mechanical risers configured to be coupled between the front-end assembly, the downconverter assembly, and the processor, wherein the staring receiver architecture comprises a sequential physical stacking along a spatial direction of the one or more mechanical risers, the front-end assembly, the downconverter assembly, and the processor, wherein the spatial direction of the sequential physical stacking is configured to extend away from a footprint of the receiver architecture as defined relative to a circuit board.

12. The staring receiver architecture of claim 11, wherein the one or more mechanical risers comprise ball grid array (BGA) interconnects configured for electrical coupling between the front-end assembly, the downconverter assembly, and the processor.

13. The staring receiver architecture of claim 11, wherein the one or more mechanical risers are configured to provide electromagnetically shielding to the front-end assembly, the downconverter assembly, and the processor.

14. The staring receiver architecture of claim 11, wherein the one or more mechanical risers are configured to thermally couple to the front-end assembly, the downconverter assembly, and the processor.

15. The staring receiver architecture of claim 11, wherein the sequential physical stacking along the spatial direction, in order, comprises:

a front end, a first riser of the one or more mechanical risers, the downconverter assembly, a second riser of the one or more mechanical risers, and the processor.

16. The staring receiver architecture of claim 11, wherein the staring receiver architecture comprises at least one heat sink.

17. The staring receiver architecture of claim 16, wherein the at least one heat sink is configured to surround at least one of the front-end assembly, the downconverter assembly, or the processor and to thermally couple to the one or more mechanical risers.

18. The staring receiver architecture of claim 11, wherein the staring receiver architecture is configured to operate in multiple frequency bands.

* * * * *